United States Patent
Neill et al.

(10) Patent No.: US 12,260,297 B2
(45) Date of Patent: Mar. 25, 2025

(54) TWO-QUBIT GATES IMPLEMENTED WITH A TUNABLE COUPLER

(71) Applicant: Google LLC, Mountain View, CA (US)

(72) Inventors: Charles Neill, Goleta, CA (US); Anthony Edward Megrant, Goleta, CA (US)

(73) Assignee: Google LLC, Mountain View, CA (US)

( * ) Notice: Subject to any disclaimer, the term of this patent is extended or adjusted under 35 U.S.C. 154(b) by 1066 days.

(21) Appl. No.: 17/271,323

(22) PCT Filed: Aug. 27, 2019

(86) PCT No.: PCT/US2019/048336
§ 371 (c)(1),
(2) Date: Feb. 25, 2021

(87) PCT Pub. No.: WO2020/046928
PCT Pub. Date: Mar. 5, 2020

(65) Prior Publication Data
US 2021/0182728 A1 Jun. 17, 2021

Related U.S. Application Data

(60) Provisional application No. 62/725,114, filed on Aug. 30, 2018.

(51) Int. Cl.
*G06N 10/40* (2022.01)
*G06N 10/70* (2022.01)
(Continued)

(52) U.S. Cl.
CPC .............. *G06N 10/40* (2022.01); *G06N 10/70* (2022.01); *H03K 19/173* (2013.01); *H03K 19/195* (2013.01)

(58) Field of Classification Search
None
See application file for complete search history.

(56) References Cited

U.S. PATENT DOCUMENTS

2017/0116542 A1* 4/2017 Shim ................. G06N 10/00

FOREIGN PATENT DOCUMENTS

| CN | 107408224 | 11/2017 |
| CN | 107924490 | 4/2018 |

(Continued)

OTHER PUBLICATIONS

Machnes et al., "Tunable, Flexible and Efficient Optimization of Control Pulses for Practical Qubits", Submitted on Mar. 2018, arXiv: 1507.04261v2, 11 pages.*

(Continued)

*Primary Examiner* — Anh Q Tran
(74) *Attorney, Agent, or Firm* — Fish & Richardson P.C.

(57) ABSTRACT

Methods, systems and apparatus for implementing two-qubit gates using a tunable coupler. In one aspect, a method of implementing a two-qubit gate includes: applying a unitary transformation control signal to a tunable coupler arranged between a first data qubit and a second data qubit to obtain a target unitary transformation of the first data qubit and the second data qubit, wherein the unitary transformation control signal is applied to the tunable coupler over a predetermined period of time to allow coupling between the first data qubit and the second data qubit through the tunable coupler.

15 Claims, 6 Drawing Sheets

(51) Int. Cl.
*H03K 19/173* (2006.01)
*H03K 19/195* (2006.01)

(56) References Cited

FOREIGN PATENT DOCUMENTS

WO  WO 2017/111949       6/2017
WO  WO-2017111949 A1 *   6/2017  ............. G01R 33/02

OTHER PUBLICATIONS

EP Office Action in European Appln. No. 19765610.1, dated Mar. 12, 2020, 3 pages (with English translation).

Machnes et al., "Gradient optimization of analytic controls: the route to high accuracy quantum optimal control," arXiv preprint arXiv:1507.04261, Jul. 2015, 11 pages.

PCT International Search Report and Written Opinion in International Appln. No. PCT/US2019/048336, dated Dec. 9, 2019, 17 pages.

Yan et al., "Tunable coupling scheme for implementing high-fidelity two-qubit gates," Physical Review Applied, Nov. 2018, 10(5):054062.

AU Office Action in Australian Appln. No. 2019333268, dated Jun. 11, 2021, 3 pages.

Bialczak et al., "Demonstration of a Tuneable Coupler for Superconducting Qubits Using Coherent, Time Domain, Two-Qubit Operations" CoRR, Submitted on Jul. 13, 2010, arXiv:1007.2219v1, 23 pages.

Geller et al., "Tunable coupler for superconducting Xmon qubits: Perturbative nonlinear model" CoRR, Submitted on May 8, 2014, arXiv:1405.1915v1, 10 pages.

Harris et al., "Sign- and magnitude-tunable coupler for superconducting flux qubits" CoRR, Submitted on Jul. 5, 2007, arXiv:cond-mat/0608253v4, 5 pages.

Machnes et al., "Tunable, Flexible and Efficient optimization of control pulses for practical qubits" Submitted on Mar. 2018, arXiv:1507.04261v2, 11 pages.

Office Action in Chinese Appln. No. 201980039667.3, mailed on Jun. 25, 2024, 16 pages (with English translation).

PCT International Preliminary Report on Patentability in International Appln. No. PCT/US2019/048336, dated Mar. 11, 2021, 10 pages.

Office Action in Canadian Appln. No. 3,102,866, dated Jan. 10, 2022, 4 pages.

* cited by examiner

TWO-QUBIT GATES IMPLEMENTED WITH A TUNABLE COUPLER

CROSS-REFERENCE TO RELATED APPLICATION

This application is a National Stage Application under 35 U.S.C. § 371 and claims the benefit of International Application No. PCT/US2019/048336, filed Aug. 27, 2019, which claims priority to U.S. Application No. 62/725,114, filed Aug. 30, 2018, entitled TWO-QUBIT GATES IMPLEMENTED WITH A TUNABLE COUPLER, the disclosures of which are incorporated herein by reference.

BACKGROUND

The present disclosure relates to quantum computing.

Classical computers have memories made up of bits, where each bit can represent either a zero or a one. Quantum computers maintain sequences of quantum bits, called qubits, where each quantum bit can represent a zero, one or any quantum superposition of zeros and ones. Quantum computers operate by setting qubits in an initial state and controlling the qubits, according to a sequence of quantum logic gates. A calculation ends with qubit readout, collapsing the system of qubits into an eigenstate where each qubit represents either a zero or one.

SUMMARY

The present disclosure describes technologies for implementing two-qubit quantum logic gates using a tunable coupler.

In general, one innovative aspect of the subject matter of the present disclosure may be embodied in methods that include: applying a unitary transformation control signal to a tunable coupler arranged between a first data qubit and a second data qubit to obtain a target unitary transformation of the first data qubit and the second data qubit, wherein the unitary transformation control signal is applied to the tunable coupler over a predetermined period of time to allow coupling between the first data qubit and the second data qubit through the tunable coupler.

The foregoing and other implementations can each optionally include one or more of the following features, alone or in combination. In some implementations, the method further comprises, selecting the unitary transformation control signal from a plurality of different candidate control signals, wherein the selected unitary transformation control signal results in a target unitary transformation of the first data qubit and second data qubit having an accuracy above a predetermined threshold when the unitary transformation control signal is applied to the tunable coupler over the predetermined period of time.

In some implementations, selecting the unitary transformation control signal from the plurality of different candidate control signals comprises: for each different candidate control signal, applying the candidate control signal to the tunable coupler, wherein two or more of the different candidate control signals comprise different maximum amplitude values, determining, for each different candidate control signal applied to the tunable coupler, a corresponding accuracy of the unitary transformation of the first data qubit and the second data qubit, and identifying the candidate control signal that results in the unitary transformation having the accuracy above the predetermined threshold.

In some implementations, the method further comprises, prior to applying each different candidate control signal to the tunable coupler: applying an off control signal to the tunable coupler to turn coupling between the first data qubit and the second data qubit off, and tuning each of the first data qubit and the second data qubit to a same resonance frequency.

In some implementations, two or more of the different candidate control signals are applied over different periods of time, the method further comprising setting the period of time associated with the identified candidate control signal as the predetermined period of time.

In some implementations, for each different candidate control signal, applying the candidate control signal to the tunable coupler comprises varying an amplitude of the candidate control signal from a first value to the maximum amplitude value of the candidate control signal.

In some implementations, for each different candidate control signal, applying the candidate control signal to the tunable coupler further comprises varying the candidate control signal from the maximum amplitude value back to the first value.

In some implementations, the first value corresponds to a value at which there is no coupling between the first data qubit and the second data qubit.

In some implementations, the different periods of time are selected based on two-qubit gate execution time.

In some implementations, the candidate control signal has a predetermined waveform profile.

In some implementations, the predetermined waveform comprises a continuous waveform profile.

In some implementations, the predetermined waveform profile is of the form amplitude(t)=constant*(1−cos(t)).

In some implementations, applying the unitary transformation control signal to the tunable coupler causes an operating frequency of the tunable coupler to change.

In some implementations, applying the unitary transformation control signal to the tunable coupler comprises applying a voltage or current signal to the tunable coupler qubit.

In some implementations, the two-qubit gate comprises a fermionic swap gate.

In some implementations, the first data qubit and the second data qubit comprise superconducting qubits.

In some implementations, the first data qubit and the second data qubit comprise transmon qubits.

The subject matter described in this specification can be implemented in particular ways so as to realize one or more of the following advantages.

Systems implementing two-qubit quantum logic gates using the techniques described in this specification can implement two-qubit gates significantly faster than systems implementing other known techniques. For example, in some cases a two-qubit gate can be implemented in 14 ns or less using the techniques described in this specification. In addition, systems implementing two-qubit gates using the techniques described in this specification achieve a reduction in circuit depth when performing computations. For example, in some cases the circuit depth to establish quantum supremacy may be 16 or 10 or less. Improved circuit depth and gate/algorithm execution time improves the operation and efficiency of the quantum computing system implementing the techniques described in this specification.

In addition, two-qubit gates implemented using the techniques described in this specification have a high fidelity and small intrinsic errors, e.g., errors not incurred due to decoherence. For example, in some cases the intrinsic error may be 8*10$^{-5}$. Implementations of two-qubit gates are also robust to control pulse shape imperfections. Two-qubit gates can be successfully implemented and achieve the desired outcome despite imperfections in the pulse shape.

Systems implementing two-qubit quantum logic gates using the techniques described in this specification can implement quantum gates (unitary operators) that are computationally hard for classical computers to simulate, e.g., fermionic SWAP gates, and therefore contribute to establishing quantum supremacy.

In addition, in some instances, implementing two-qubit gates using the techniques described in this specification requires reduced physical and computational complexity due, e.g., to the range and flexibility of the waveform profiles of pulses that can be applied to a tunable coupler of the two-qubit system. For example, the techniques for implementing two-qubit gates described in this specification do not require the knowledge of electronic transfer functions to reverse engineer a suitable control sequence or control waveform for the directly adjustable control parameters, e.g., a voltage, in order to realize a desired gate. Instead, the presently described techniques allow for the calibration and implementation of the gate by directly tuning those control parameters. In addition, unlike other known techniques, control waveforms are not restricted or limited by particular coupler realizations or signal interaction trajectories provided by couplers. Two-qubit gates that form a universal set of quantum gates in combination with single qubit gates can be realized using the techniques described in this specification. For example, a fermionic SWAP gate together with single qubit gates form a universal set of quantum gates.

Systems implementing two-qubit quantum gates using techniques described in this specification may avoid frequency crowding. Two-qubit gates implemented using techniques described in this specification may be performed simultaneously on systems of qubits including more than two qubits without frequency collisions and unwanted interactions. Unwanted interactions with neighboring qubits can be turned off using the controllable coupler. Performing two-qubit gates simultaneously may reduce the circuit depth. For example, performing two-qubit gates simultaneously may reduce the circuit depth by a factor of 2 compared to not performing two-qubit gates simultaneously.

Details of one or more implementations of the subject matter of this specification are set forth in the accompanying drawings and the description below. Other features, aspects, and advantages of the subject matter will become apparent from the description, the drawings, and the claims.

DETAILED DESCRIPTION

This specification describes methods and systems for implementing high fidelity two-qubit quantum logic gates with reduced execution time by tuning directly adjustable control parameters that are associated with corresponding gate parameters.

A tunable coupler is positioned between two qubits. The qubits and tunable coupler are configured and arranged such that, during operation of the qubits, the tunable coupler provides a dynamic control range of the interaction between the two qubits—including an OFF state with zero interaction between the two qubits. The tunable coupler and, in turn, the interaction between the two qubits is tuned by directly adjusting a control parameter, e.g., by adjusting a voltage. Therefore, a two-qubit gate can be implemented by directly adjusting the control parameter according to a corresponding control waveform over a predetermined duration or period of time. Knowledge of the functional dependence of the two-qubit gate on a tunable coupler parameter, e.g., a tunable coupler frequency, or an associated control parameter, e.g., a voltage, is not required.

The specific form of the control waveform is determined by performing a series of experiments. For example, a set of maximum values for a respective control parameter is chosen, e.g., a set of maximum values for a voltage. The respective control parameter is then continuously increased from an initial voltage to one of the chosen maximum values and decreased back to the initial voltage over some fixed chosen period of time. This tuning of the coupler results in a corresponding tuning of the interaction between the two qubits and a corresponding unitary transformation of the qubits.

By determining the initial state of the qubits before an interaction and measuring the state of the qubits after the different interactions corresponding to different control waveforms for different maximum values of that control parameter, the unitary transformation associated with the respective control waveform of the control parameter can be determined as a function of that control parameter, e.g. a voltage. The maximum value of the control parameter and the duration corresponding to a particular unitary transformation only have to be determined once. Afterwards, the unitary transformation can be realized by continuously increasing the value of the control parameter to the determined corresponding maximum value and continuously decreasing it back to the initial value in the determined time interval. A broad range of waveform profiles can be used to achieve a specific two-qubit gate operation with high fidelity.

Example Operating Environment

Figure 1:
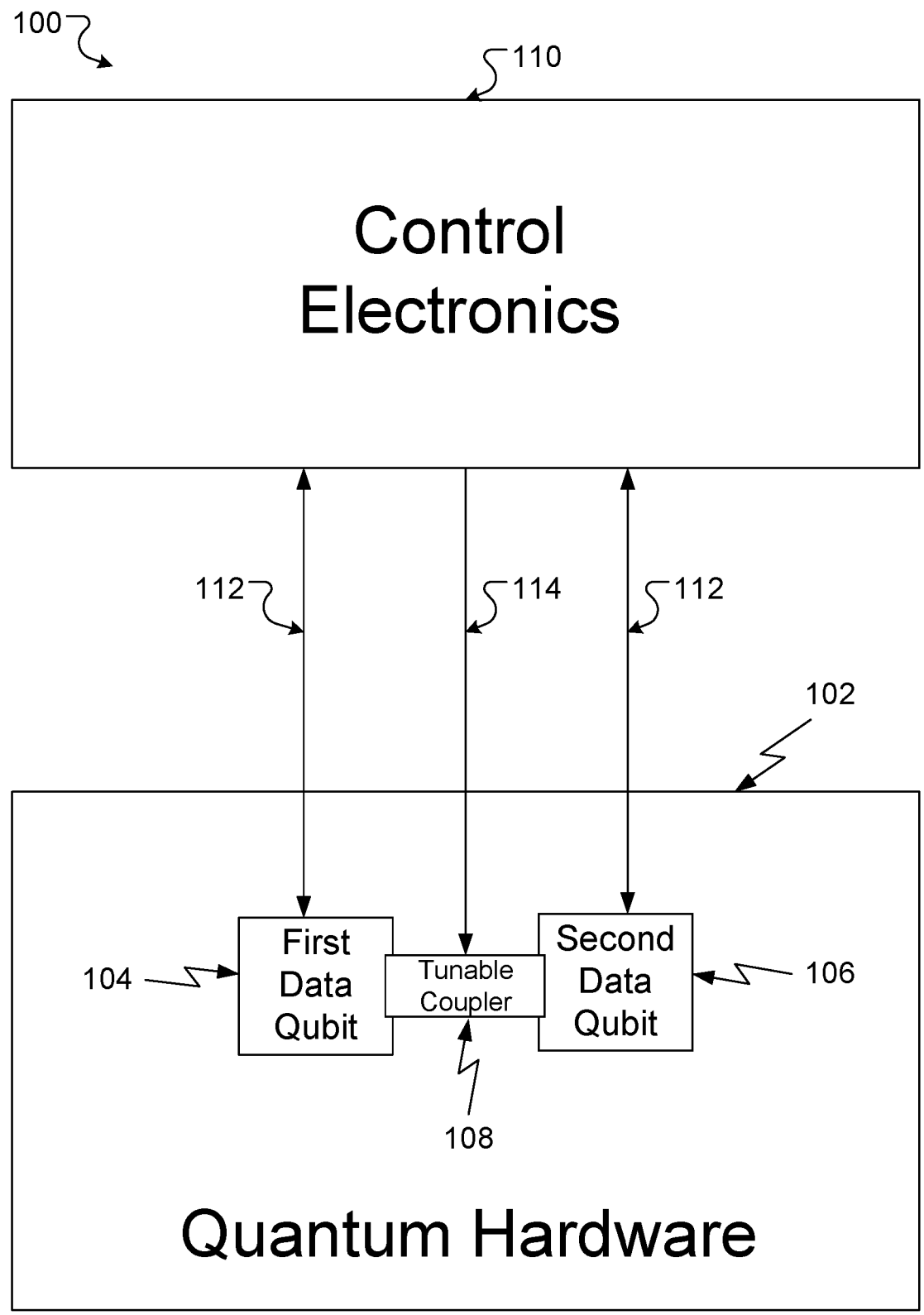
FIG. 1 depicts an exemplary system for implementing two-qubit gates with a tunable coupler.

FIG. 1 is an example system that can perform the methods described with reference to FIGS. 2 and 3.

The system 100 includes quantum hardware 102 that includes at least a first data qubit 104, a second data qubit 106, and a tunable coupler 108 between the first data qubit and the second data qubit. The first data qubit 104, the second data qubit 106, and the tunable coupler 108 may be subcomponents of the quantum hardware 102. For example, Quantum hardware 108 may include additional data qubits and additional tunable couplers. Each of the first data qubit 104, the second data qubit 106, and the tunable coupler 108 may be frequency-tunable.

The first data qubit 104 and the second data qubit 106 may be superconducting qubits. For example, the first data qubit 104 and the second data qubit 106 may be transmon qubits. Other qubit architectures may be used instead.

Various different tunable coupler designs may be used. For example, the tunable coupling 108 may include a three-terminal device constructed from superconductor materials using a fixed negative mutual inductance and a single, current-biased Josephson junction that acts as a tunable positive inductance. Further discussion and examples of tunable couplers are described in detail in "A tunable coupling scheme for implementing high-fidelity two-qubit gates", Fei Yan et al., arxiv:quant-ph/180309813v1, "Demonstration of a Tuneable Coupler for Superconducting Quoits Using Coherent, Time Domain, Two-Qubit Operations", R. C. Bialczak et al., arxiv: quant-ph/1007.2219v1, "Sign- and magnitude-tunable coupler for superconducting flux qubits", and R. Harris et al., arxiv: cond-mat/0608253v4, "Tunable coupler for superconducting Xmon qubits: Perturbative nonlinear model", Michael R. Geller et al., arxiv:quant-ph/1405.1915v1, each of which is incorporated herein by reference in its entirety.

The system 100 includes control electronics 110. Control electronics 110 may include an arbitrary waveform generator.

The system 100 includes qubit control lines 112 from the control electronics 110 to the first data qubit 104 and the second data qubit 106, respectively. For example, the frequency of the first data qubit 104 and the second data qubit 106 can be tuned using qubit control lines 112. The frequency of the first data qubit 104 and the second data qubit 106 may be tuned by applying a control signal to the qubit control lines 112 via control electronics 110. In addition, control electronics 110 can perform measurements of the first data qubit 104 and the second data qubit 106 through qubit control lines 112. Measurement of the first data qubit 104 and measurement of the second data qubit 106 determines the state of the first data qubit 104 and the second data qubit 106, respectively. Control electronics 110 can store, display, and/or further process the results of each of the measurements of the first data qubit 104 and the second data qubit 106.

The system 100 includes tunable coupler control line 114. Control electronics 110 can dynamically tune the coupling or interaction between the first data qubit 104 and the second data qubit 106 by applying a control signal to the tunable coupler control line 114 to tune the tunable coupler 108 frequency. For example, control electronics 110 may apply a voltage pulse to the tunable coupler control line 114 to tune the tunable coupler 108 frequency. In some implementations, the control electronics 110 may include a data processing apparatus and associated memory. The memory may include a computer program having instructions that, when executed by the data processing apparatus, cause the data processing apparatus to perform one or more functions described herein, such as applying a control signal to a qubit and/or to a tunable coupler.

Example Method for Implementing Two-Qubit Gates Using a Tunable Coupler

Figure 2:
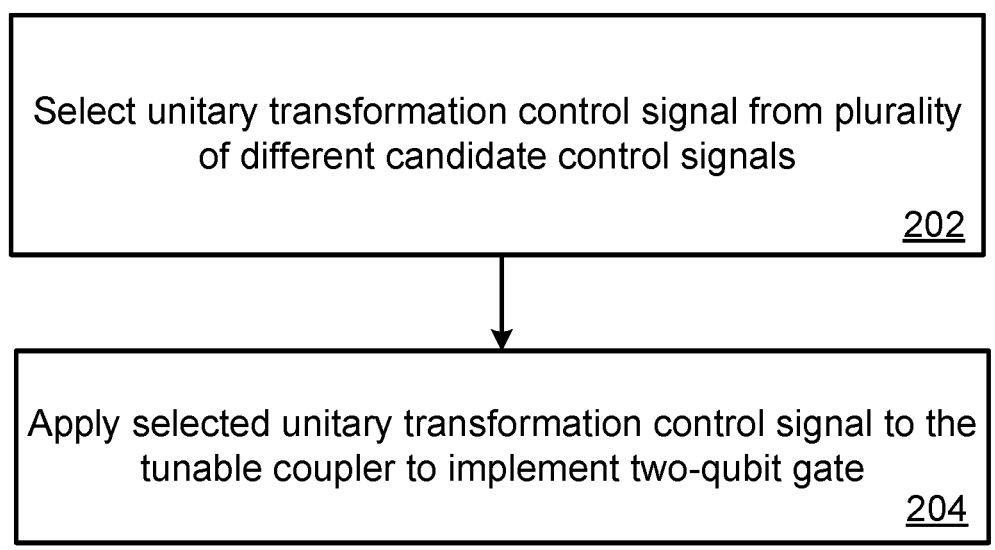
FIG. 2 is a flow diagram of an exemplary process for implementing a two-qubit gate on a first data qubit and a second data qubit using a tunable coupler arranged between the first data qubit and second data qubit.

FIG. 2 is a flow diagram of an example process 200 for implementing a two-qubit gate on a first data qubit and a second data qubit using a tunable coupler arranged between the first data qubit and second data qubit. For example, the process 200 may be used to implement a fermionic SWAP gate on a first data qubit and a second data qubit. For convenience, the process 200 will be described as being performed by quantum hardware in communication with control electronics located in one or more locations. For example, the system 100 of FIG. 1, appropriately programmed in accordance with this specification, can perform the process 200.

In a first step of the process, a unitary transformation control signal that, when applied to the first data qubit and second data qubit, implements the two-qubit gate is selected from a plurality of different candidate control signals (step 202). The selected unitary transformation control signal results in a target unitary transformation of the first data qubit and second data qubit having an accuracy above a predetermined threshold when the unitary transformation control signal is applied to the tunable coupler over the predetermined period of time.

The predetermined threshold for the accuracy of the target unitary transformation may be determined based on a target fidelity of the two-qubit gate. For example, the predetermined threshold for the accuracy may be selected as being above a critical value to successfully perform a quantum algorithm using the two-qubit gate or to successfully establish quantum supremacy using the two-qubit gate.

The plurality of different candidate control signals may have a predetermined waveform profile. In some cases the predetermined waveform profile may be a continuous waveform profile, e.g., of the form amplitude(t)=constant*(1−cos (t)). However, the waveform profile can vary as long as a maximum amplitude, the predetermined period of time and the area under the amplitude trajectory are fixed to predetermined values. This allows for a broad range of different control waveforms to realize the two-qubit gate. In some cases the period of the cosine can also be varied. However, to minimize the effect of decoherence a shorter total pulse length that does not degrade an intrinsic fidelity of the gate may be chosen. An example process for determining the unitary transformation control signal is described below with reference to FIG. 3.

In a second step of the process, the unitary transformation control signal selected in step 202 is applied to the tunable coupler to obtain the target unitary transformation of the first data qubit and the second data qubit (step 204). Applying the unitary transformation control signal to the tunable coupler may include applying a voltage or current signal to the tunable coupler, causing an operating frequency of the tunable coupler to change. The unitary transformation control signal is applied to the tunable coupler over a predetermined period of time to allow coupling between the first data qubit and the second data qubit through the tunable coupler. The predetermined period of time may be selected based on a target two-qubit gate execution time, as described below with reference to FIG. 3.

Figure 3:
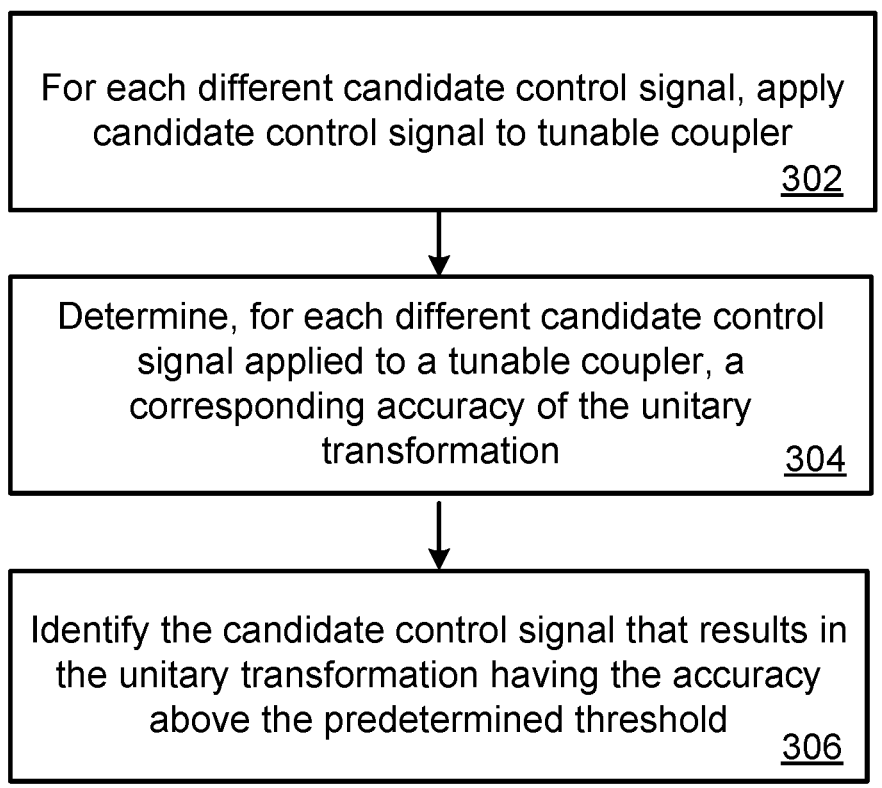
FIG. 3 is a flow diagram of an example process for selecting a unitary transformation control signal from multiple different candidate control signals.

FIG. 3 is a flow diagram of an example process 300 for selecting a unitary transformation control signal from multiple different candidate control signals. For convenience, the process 300 will be described as being performed by quantum hardware in communication with control electronics located in one or more locations. For example, the system 100 of FIG. 1, appropriately programmed in accordance with this specification, can perform the process 300.

In a first step of the process, each different candidate control signal is applied to the tunable coupler (step 302). Two or more of the different candidate control signals have different maximum amplitude values. The different maximum amplitude values for the different candidate control signals may be selected based on the hardware implementing the two-qubit gate. For example, the maximum amplitude values may be selected as being below a critical value that could cause unwanted transitions of the first data qubit or the second data qubit into non-computational basis states.

Prior to application of a candidate control signal to the tunable coupler, the first data qubit and the second data qubit may be tuned to a same resonance frequency. Tuning the first data qubit and second data qubit to a same resonance frequency aligns the first qubit and second qubit and enables the tunable coupler to facilitate interaction between the first qubit and second qubit. For example, the first data qubit and the second data qubit may be tuned to a resonance frequency of 6 GHz or to a resonance frequency in the range between 5 GHz and 7 GHz. In addition, an off control signal may be applied to the tunable coupler to turn coupling between the first data qubit and the second data qubit off. The candidate control signal may then be applied to the tunable coupler.

Applying two or more of the different candidate control signals to the tunable coupler may include applying the two or more different candidate control signals to the tunable coupler over different periods of time. The different periods of time may be selected based on a target two-qubit gate execution time and specifics of the hardware implementing the two-qubit gate. For example, the candidate periods of time may include periods of time that are slow enough so as not to cause unwanted transitions of the first data qubit or second data qubit into non-computational basis states, but close enough to a target gate execution time. For example, in some cases the smallest distance between computational basis states and non-computational basis states may be at least 200-250 MHz. In these cases the candidate periods of time may be chosen to be longer than $1/200$ MHz, e.g., 5 ns, 6 ns, 7 ns, 8 ns or slower.

Applying a candidate control signal to the tunable coupler may include varying the candidate control signal amplitude from a first value, e.g., a value at which there is no coupling between the first data qubit and the second data qubit, to the maximum amplitude value for that particular candidate control signal. Optionally, this may further include varying the candidate control signal from the maximum amplitude value back to the first value.

In a second step of the process, a corresponding accuracy of the unitary transformation of the first data qubit and the second data qubit is determined for each different candidate control signal applied to the tunable coupler (step 304). The accuracy may be determined by measuring the state of the first data qubit and second data qubit after each application of one of the different candidate control signals to the tunable coupler.

In a third step of the process, a candidate control signal that results in the unitary transformation having the accuracy above the predetermined threshold is identified (step 306). The period of time associated with the identified candidate control signal may be set as the predetermined period of time. An example unitary transformation control signal for implementing a two-qubit fermionic SWAP gate identified using processes 200 and 300 is described below with reference to FIGS. 4-6.

Figure 4:
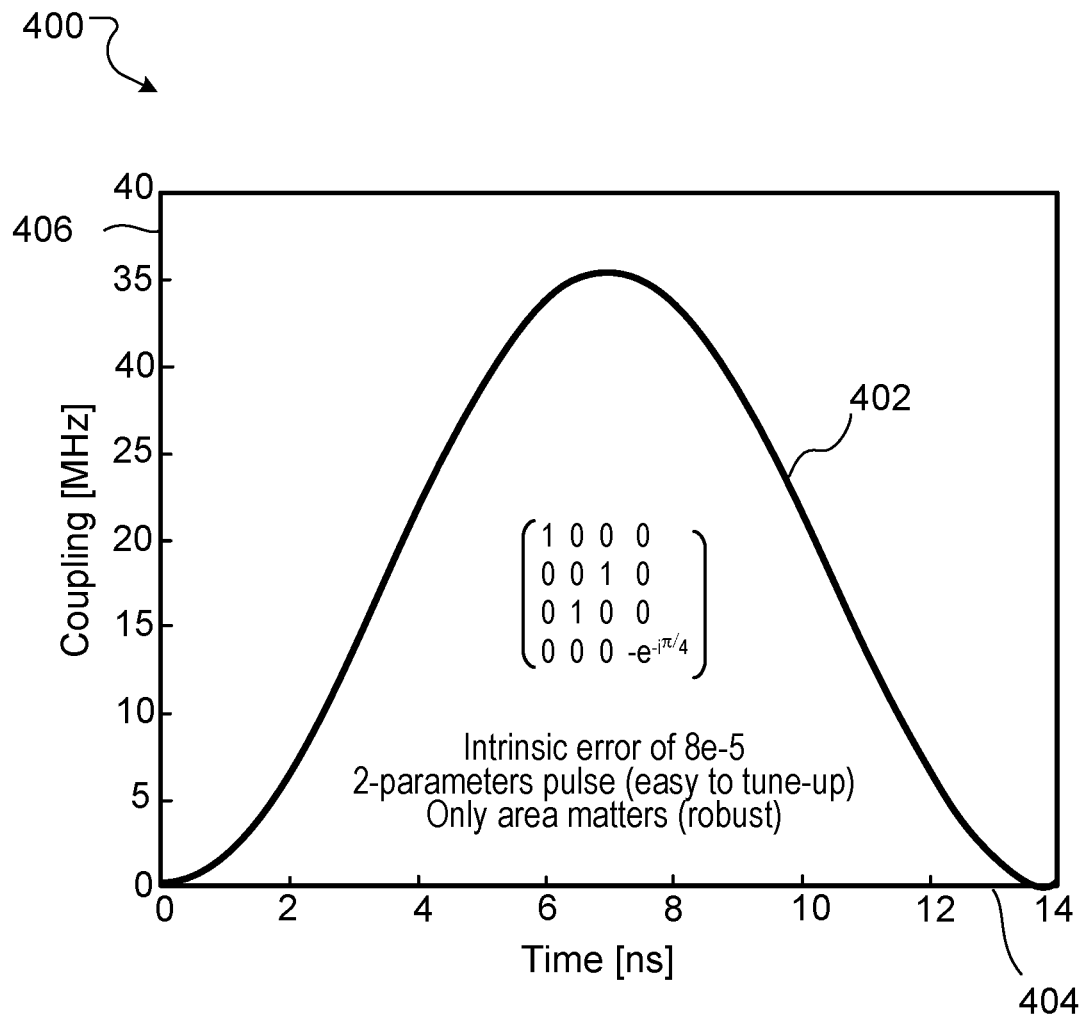
FIG. 4 is a plot showing an example unitary transformation control signal waveform for implementing a two-qubit fermionic SWAP gate.

FIG. 4 is a plot 400 showing an example unitary transformation control signal waveform for implementing a two-qubit fermionic SWAP gate represented by the 4×4 matrix $$\begin{pmatrix} 1 & 0 & 0 & 0 \\ 0 & 0 & 1 & 0 \\ 0 & 1 & 0 & 0 \\ 0 & 0 & 0 & -e^{-i\pi/4} \end{pmatrix}.$$

The plot includes a horizontal axis 404 representing time (ns) and a vertical axis 406 representing coupling strength (MHz) (voltage applied to the tunable coupler control line). The unitary transformation control signal waveform 402 is an example of a waveform determined using methods 200 and 300 described with reference to FIGS. 2 and 3. For example, the unitary transformation control signal waveform 302 is configured to implement the fermionic SWAP gate on a first data qubit and second data qubit through application to a tunable coupler positioned between the first data qubit and second data qubit.

The unitary transformation control signal waveform 402 is one non-limiting example of many unitary transformation control signal waveforms that can realize the, fermionic SWAP gate. For example, the same target unitary transformation may also be realized using control signal waveforms with different durations in combination with different maximum amplitudes. The same target unitary transformation may also be realized for different waveform profiles as long as the maximum amplitude, duration, and area beneath the amplitude curve are the same. Generally, different unitary transformation control signal waveforms in combination with the same or different durations and maximum amplitudes can be determined using the method 200 described with respect to FIG. 2 to realize different target unitary transformations.

As shown in plot 400, the unitary transformation control signal waveform 402 can perform the two-qubit fermionic SWAP operation in 14 ns. Alternative methods for implementing two-qubit fermionic SWAP operations may be 3 times slower. In addition, the fermionic SWAP gate realized via the unitary transformation control signal waveform 402 has an intrinsic error of $8\times10^{-5}$.

Figure 5:
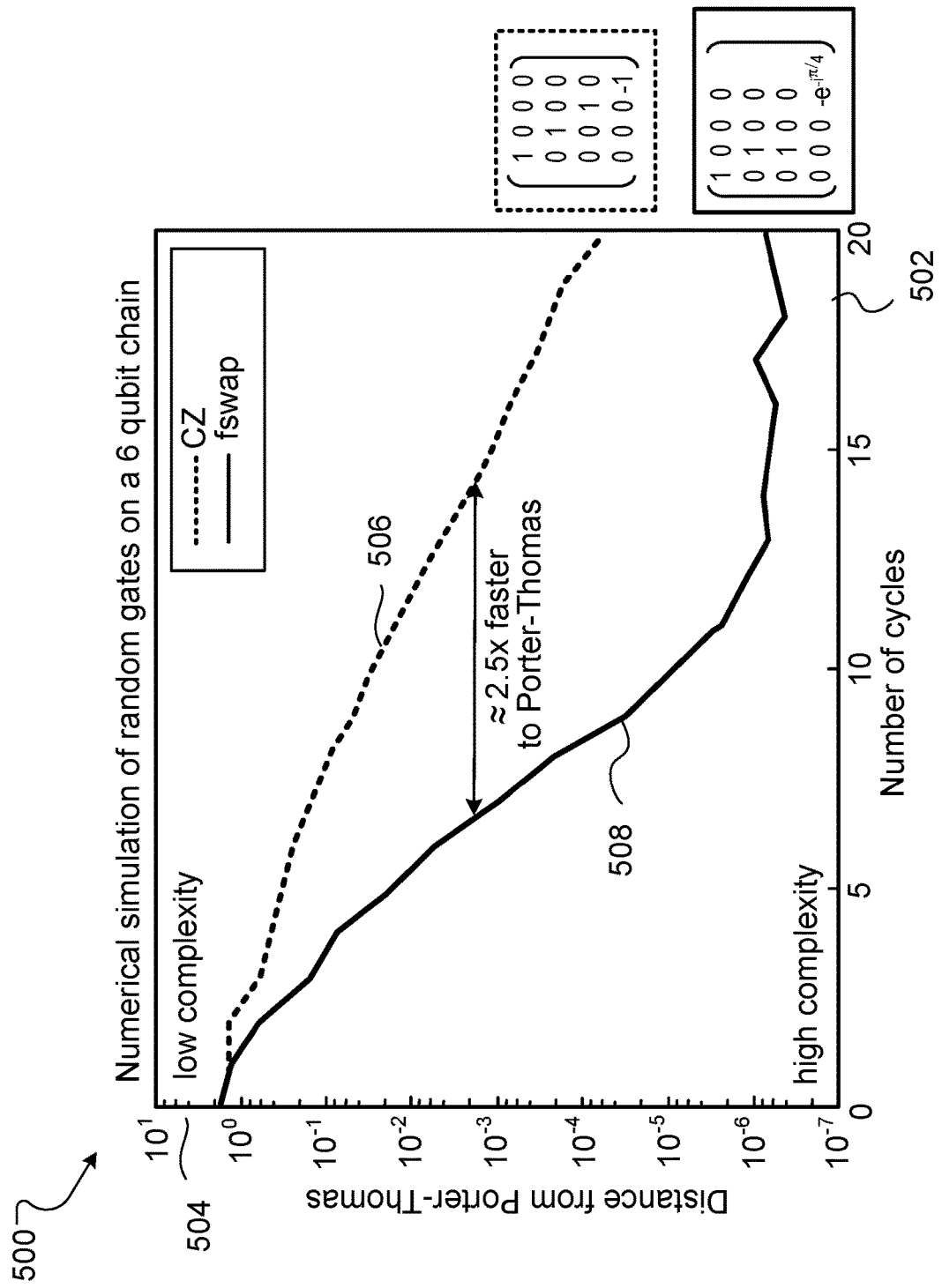
FIG. 5 is a plot comparing results of numerically simulating randomly chosen quantum gates on a 6 qubit chain.

FIG. 5 is a plot 500 comparing results of numerically simulating randomly chosen quantum gates on a 6 qubit chain. The plot includes a horizontal axis 502 representing the number of cycles of gate application and a vertical axis 504 representing distance from the Porter-Thomas distribution, i.e., a metric of computational complexity. The first line 506 shows the results of simulating randomly chosen quantum gates using controlled Z (CZ) gate. The second line 508 shows the results of simulating randomly chosen quantum gates using fermionic SWAP gates realized using the unitary transformation control signal waveforms described herein.

As shown in plot 500, use of fermionic SWAP gates instead of CZ gates results in convergence to the Porter-Thomas distribution with 2.5 times reduced circuit depth.

Figure 6:
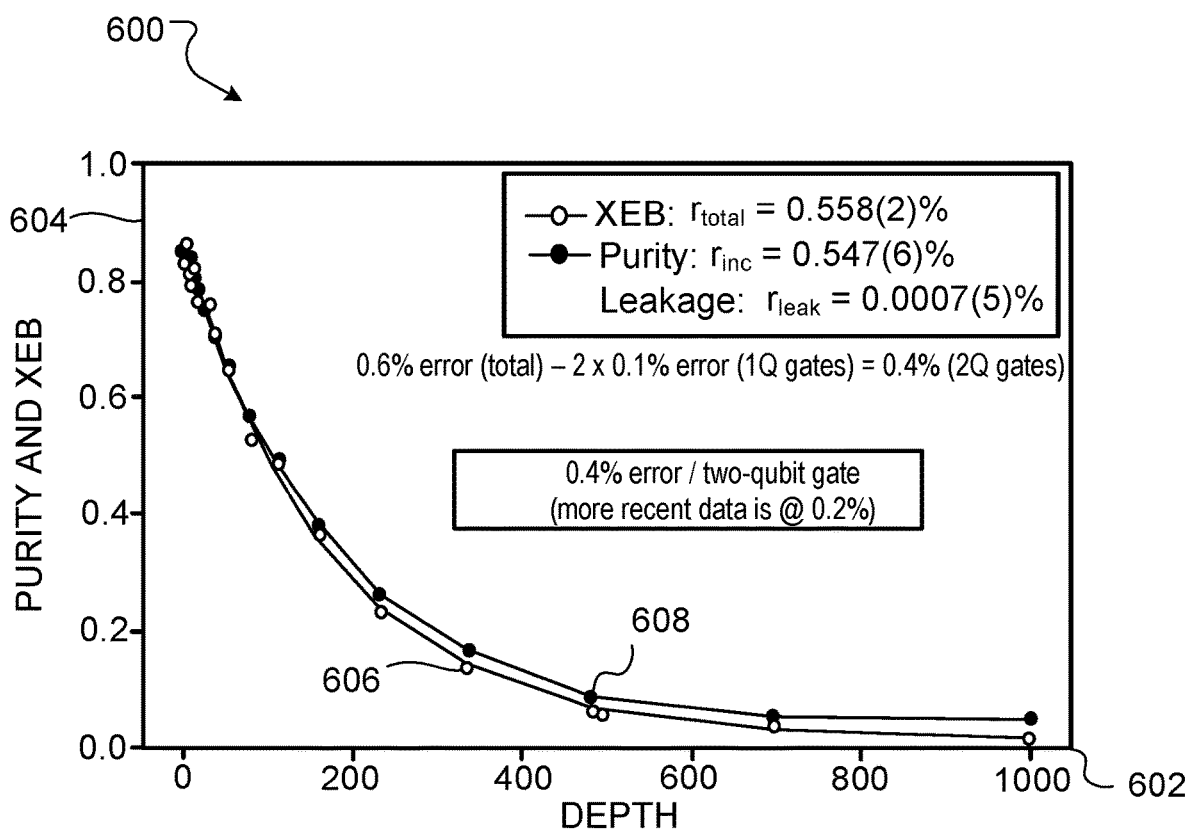
FIG. 6 is a plot showing simulation results for a fermionic SWAP gate implemented using the techniques described in the present disclosure.

FIG. 6 is a plot 600 showing simulation results for a fermionic SWAP gate implemented using the techniques described in the present disclosure. The plot includes a horizontal axis 602 representing circuit depth and a vertical axis 604 representing the performance metrics purity and cross entropy benchmarking (XEB), both of which take values between 0 and 1. Cross entropy measures the total fidelity of the fermionic SWAP gate. Purity measures errors from decoherence.

The simulation results show that the cross entropy (606) nearly coincides with the purity measure (608), implying that a quantum algorithm using the fermionic SWAP gate is a coherence limited algorithm. Further, the simulation results show that a fermionic SWAP gate realized by applying a unitary transformation control signal to a tunable coupler as described with reference to FIGS. 2 and 3 has high fidelity and the error per fermionic SWAP gate is about 0.4% or about 0.2%. An error of 0.2% is approximately 3 times smaller than the smallest two-qubit gate error achieved using other known techniques.

Implementations of the subject matter and operations described in this specification can be implemented in digital electronic circuitry, analog electronic circuitry, suitable quantum circuitry or, more generally, quantum computational systems, in tangibly-embodied software or firmware, in computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Implementations of the subject matter described in this specification can be implemented as one or more computer programs, i.e., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable computers, operating with one or more processors, as appropriate, executing one or more computer programs to perform functions by operating on input data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more computers to be "configured to" perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions. For example, a quantum computer may receive instructions from a digital computer that, when executed by the quantum computing apparatus, cause the apparatus to perform the operations or actions.

Computers suitable for the execution of a computer program can be based on general or special purpose processors, or any other kind of central processing unit. Generally, a central processing unit will receive instructions and data from a read-only memory, a random access memory, or quantum systems suitable for transmitting quantum data, e.g. photons, or combinations thereof.

The elements of a computer include a central processing unit for performing or executing instructions and one or more memory devices for storing instructions and digital, analog, and/or quantum data. The central processing unit and the memory can be supplemented by, or incorporated in, special purpose logic circuitry or quantum simulators. Generally, a computer will also include, or be operatively coupled to receive data from or transfer data to, or both, one or more mass storage devices for storing data, e.g., magnetic, magneto-optical disks, optical disks, or quantum systems suitable for storing quantum information. However, a computer need not have such devices.

Quantum circuit elements (also referred to as quantum computing circuit elements) include circuit elements for performing quantum processing operations. That is, the quantum circuit elements are configured to make use of quantum-mechanical phenomena, such as superposition and entanglement, to perform operations on data in a non-deterministic manner. Certain quantum circuit elements, such as qubits, can be configured to represent and operate on information in more than one state simultaneously. Examples of superconducting quantum circuit elements include circuit elements such as quantum LC oscillators, qubits (e.g., flux qubits, phase qubits, or charge qubits), and superconducting quantum interference devices (SQUIDS) (e.g., RF-SQUID or DC-SQUID), among others.

In contrast, classical circuit elements generally process data in a deterministic manner. Classical circuit elements can be configured to collectively carry out instructions of a computer program by performing basic arithmetical, logical, and/or input/output operations on data, in which the data is represented in analog or digital form. In some implementations, classical circuit elements can be used to transmit data to and/or receive data from the quantum circuit elements through electrical or electromagnetic connections. Examples of classical circuit elements include circuit elements based on CMOS circuitry, rapid single flux quantum (RSFQ) devices, reciprocal quantum logic (RQL) devices and ERSFQ devices, which are an energy-efficient version of RSFQ that does not use bias resistors.

In certain cases, some or all of the quantum and/or classical circuit elements may be implemented using, e.g., superconducting quantum and/or classical circuit elements. Fabrication of the superconducting circuit elements can entail the deposition of one or more materials, such as superconductors, dielectrics and/or metals. Depending on the selected material, these materials can be deposited using deposition processes such as chemical vapor deposition, physical vapor deposition (e.g., evaporation or sputtering), or epitaxial techniques, among other deposition processes. Processes for fabricating circuit elements described herein can entail the removal of one or more materials from a device during fabrication. Depending on the material to be removed, the removal process can include, e.g., wet etching techniques, dry etching techniques, or lift-off processes. The materials forming the circuit elements described herein can be patterned using known lithographic techniques (e.g., photolithography or e-beam lithography).

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties. A superconductor (alternatively superconducting) material can be understood as material that exhibits superconducting properties at or below a superconducting critical temperature. Examples of superconducting material include aluminum (superconductive critical temperature of 1.2 kelvin) and niobium (superconducting critical temperature of 9.3 kelvin). Accordingly, superconducting structures, such as superconducting traces and superconducting ground planes, are formed from material that exhibits superconducting properties at or below a superconducting critical temperature.

In certain implementations, control signals for the quantum circuit elements (e.g., qubits and qubit couplers) may be provided using classical circuit elements that are electrically and/or electromagnetically coupled to the quantum circuit elements. The control signals may be provided in digital and/or analog form.

Computer-readable media suitable for storing computer program instructions and data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a computer program product that includes instructions that are stored on one or more non-transitory machine-readable storage media, and that are executable on one or more processing devices. The systems described in this specification, or portions of them, can each be implemented as an apparatus, method, or system that may include one or more processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method of implementing a two-qubit gate, the method comprising:
   selecting a unitary transformation control signal from a plurality of different candidate control signals, wherein the selected unitary transformation control signal results in a target unitary transformation of a first data qubit and a second data qubit having an accuracy above a predetermined threshold when the unitary transformation control signal is applied to a tunable coupler arranged between the first data qubit and the second data qubit over a predetermined period of time;
   wherein selecting the unitary transformation control signal from the plurality of different candidate control signals comprises
      for each different candidate control signal, applying the candidate control signal to the tunable coupler, wherein two or more of the different candidate control signals comprise different maximum amplitude values,
      determining, for each different candidate control signal applied to the tunable coupler, a corresponding accuracy of the unitary transformation of the first data qubit and the second data qubit, and
      identifying one of the candidate control signals as the selected unitary transformation control signal, wherein the identified one of the candidate control signals has a corresponding accuracy above the predetermined threshold; and
   applying the selected unitary transformation control signal to the tunable coupler arranged between the first data qubit and the second data qubit to obtain the target unitary transformation of the first data qubit and the second data qubit,
   wherein the selected unitary transformation control signal is applied to the tunable coupler over the predetermined period of time to allow coupling between the first data qubit and the second data qubit through the tunable coupler.

2. The method of claim 1, further comprising, prior to applying each different candidate control signal to the tunable coupler:
   applying an off control signal to the tunable coupler to turn coupling between the first data qubit and the second data qubit off; and
   tuning each of the first data qubit and the second data qubit to a same resonance frequency.

3. The method of claim 1, wherein two or more of the different candidate control signals are applied over different periods of time, the method further comprising setting the period of time associated with the identified candidate control signal as the predetermined period of time.

4. The method of claim 1, wherein, for each different candidate control signal, applying the candidate control signal to the tunable coupler comprises varying an amplitude of the candidate control signal from a first value to the maximum amplitude value of the candidate control signal.

5. The method of claim 4, wherein, for each different candidate control signal, applying the candidate control signal to the tunable coupler further comprises varying the candidate control signal from the maximum amplitude value back to the first value.

6. The method of claim 4, wherein the first value corresponds to a value at which there is no coupling between the first data qubit and the second data qubit.

7. The method of claim 3, wherein the different periods of time are selected based on two-qubit gate execution time.

8. The method of claim 1, wherein each candidate control signal of the plurality of different candidate control signals has a different predetermined waveform profile.

9. The method of claim 8, wherein each predetermined waveform comprises a different continuous waveform profile.

10. The method of claim 9, wherein at least one predetermined waveform profile is of the form amplitude(t) =constant*(1−cos(t)).

11. The method of claim 1, wherein applying the unitary transformation control signal to the tunable coupler causes an operating frequency of the tunable coupler to change.

12. The method of claim 1, wherein applying the unitary transformation control signal to the tunable coupler comprises applying a voltage or current signal to the tunable coupler.

13. The method of claim 1, wherein the two-qubit gate comprises a fermionic swap gate.

14. The method of claim 1, wherein the first data qubit and the second data qubit comprise superconducting qubits.

15. The method of claim 1, wherein the first data qubit and the second data qubit comprise transmon qubits.

* * * * *